United States Patent [19]

Tsaur et al.

[11] Patent Number: 4,853,076

[45] Date of Patent: *Aug. 1, 1989

[54] SEMICONDUCTOR THIN FILMS

[75] Inventors: Bor-Yeu Tsaur, Arlington; John C. C. Fan, Chestnut Hill; Michael W. Geis, Acton, all of Mass.

[73] Assignee: Massachusetts Institute of Technology, Cambridge, Mass.

[*] Notice: The portion of the term of this patent subsequent to Feb. 1, 2000 has been disclaimed.

[21] Appl. No.: 70,599

[22] Filed: Jul. 9, 1987

Related U.S. Application Data

[63] Continuation of Ser. No. 566,579, Dec. 29, 1983, abandoned, which is a continuation of Ser. No. 301,199, Sep. 11, 1981, abandoned.

[51] Int. Cl.$^4$ .......................... C30B 1/02; C30B 29/60
[52] U.S. Cl. ................................. 156/603; 156/616.2; 156/620.71; 156/DIG. 73; 156/DIG. 64; 156/DIG. 88; 437/247; 437/976
[58] Field of Search ........... 156/603, 617 R, DIG. 73, 156/DIG. 88, DIG. 64, DIG. 80; 427/95, 96; 148/175

[56] References Cited

U.S. PATENT DOCUMENTS

| | | | |
|---|---|---|---|
| 2,992,903 | 7/1961 | Imber | 156/DIG. 88 |
| 3,160,521 | 12/1964 | Ziegler et al. | 156/DIG. 88 |
| 3,160,522 | 12/1964 | Heymans et al. | 156/DIG. 88 |
| 3,549,432 | 12/1970 | Sivertsen | 156/DIG. 80 |
| 3,969,753 | 7/1976 | Thorsew, Jr. et al. | 148/DIG. 115 |
| 4,177,372 | 12/1979 | Kotera et al. | 156/617 R |
| 4,308,078 | 12/1981 | Cook | 156/617 R |
| 4,323,417 | 4/1982 | Lam | 156/DIG. 88 |
| 4,330,363 | 5/1982 | Biegesen et al. | 156/DIG. 102 |
| 4,371,421 | 2/1983 | Fan et al. | 156/617 R |
| 4,693,758 | 9/1987 | Kubayashi et al. | 437/174 |

OTHER PUBLICATIONS

Allison et al., Proceedings of the IEEE, V57, Sep. 69, pp. 1490-1498.

Cherry, Proceedings of the 13th Power Sources Conf. 4/59, pp. 62-66.
Geis et al., Appl. Phys. Lett., V35, 7/79, pp. 71-74.
Chv et al., J. of App. Phys., V48, 11/77, pp. 4848-4849.
Geis et al., Silicon Graphoepitaxy Using a Strip-Heater Oven, Applied Phys. Lett. 37(5), Sep. 1, 1980, pp. 454-456.
Biegelsew et al., Laser-Induced Crystallization of Silicon Island on a Morphorous Multilayer Structures, Applied Phys. Lett. 38(3), Feb. 1, 1981, pp. 150-152.
"Elastoresistance of n-Type Silicon on Sapphire", Journal of Applied Physics V45, No., Jun. 6, 1974, by Hynecek.
"Stress-Relieved Regrowth of Silicon on Sapphire by Laser Annealing", Appl. Phys. Lett., 36(6), Mar. 15, 1980, by Sai-Halasz et al.
"Piezoresistance Effect in Germanium and Silicon", Phys. Rev. V94, 42, 1954 by Smith.
"Determination of Existing Stress in Silicon Films on Sapphire Substrate Using Raman Spectroscopy", Solid State Electronics, vol. 23, pp. 31-33, 1980 by Englert et al.

Primary Examiner—Gary P. Straub
Attorney, Agent, or Firm—Hamilton, Brook, Smith & Reynolds

[57] ABSTRACT

An improved method and apparatus for optimizing the electrical properties while crystallizing material is disclosed. In this invention, a material which is to be crystallized is formed on a substrate and subjected to a heat treatment to intentionally induce thermal stress while crystallizing the material. The heat treatment melts the material being crystallized and when the material solidifies, a built-in stress is retained which, in the case of n-doped Si on fused silica results in a tensile stress which produces an electron mobility in the film of 870 cm$^2$/volt-sec as compared to similarly fashioned unstressed n-doped Si on SiO$_2$ coated Si which has an electron mobility of 500 cm$^2$/volt-sec.

16 Claims, 1 Drawing Sheet

SEMICONDUCTOR THIN FILMS

This is a continuation of co-pending application Ser. No. 556,679 filed on Dec. 29, 1983 now abandoned which is a continuation of application Ser. No. 301,199, filed 9/11/81, now abandoned.

GOVERNMENT SUPPORT

Work described herein was supported by the U.S. Air Force.

TECHNICAL FIELD

This invention is in the field of materials and more particularly relates to the production of sheets, films or layers of crystalline material and in particular, semiconductor crystalline material useful in integrated circuits, solar cells and discrete devices.

BACKGROUND ART

Much of modern technology makes use of thin solid films on the surfaces of solid substrates. A number of methods have been used to deposit such thin films including thermal evaporation, DC sputtering, RF sputtering, ion beam deposition, chemical vapor deposition, plating, molecular beam deposition and deposition from the liquid phase.

The structure of thin films can be amorphous (that is, the atoms of the film are not arranged in any crystalline order), randomly polycrystalline (that is, the film is composed of many small regions, in each of which the atoms are arranged in a regular crystalline order, but the small regions have no mutual alignment of their crystallographic axes), textured-polycrystalline (that is, the film is composed of many small regions, in each of which the atoms are arranged in a regular crystalline order, and one or more of the crystalline axes of the majority of said regions are parallel), or epitaxial (that is, the film is predominantly of a single crystallographic orientation). An epitaxial or nearly single crystal film is a special case of a preferred orientation film in which corresponding crystallographic axes of all the small regions are essentially oriented in the same directions. A thin film can be the same material (that is, the same element or compound) as the substrate (producing a "homogeneous" structure), or it can differ in chemical composition from the substrate (producing a heterogeneous structure). If the film is epitaxial, the former is called "homoepitaxy" and the latter "heteroepitaxy".

By "crystallization" is meant the process of arranging the atoms of a substance in a crystalline order. For convenience, the term should also be understood to encompass "recrystallization" as well, when referring to a substance which already has some degree of crystalline order, in which case, the atoms are arranged in a higher crystalline order by "recrystallization".

In the process of fabricating thin films on a substrate, the films may be subjected to forces which induce stress in the film. For example, under certain conditions, when heat is applied to materials (as usually occurs in the process of fabricating thin films) thermal stress can be induced in the film.

The stress "S" induced in a thin film (Material 1) supported by a substrate (Material 2) is essentially "two dimensional" and may be approximated by Equation 1 below:

Equation 1 $S \propto (\alpha_1 \Delta T_1 - \alpha_2 \Delta T_2)$ wherein
$\Delta T_1 = T_1 - T_0$
$\Delta T_2 = T_2 - T_0$
$T_0$ = a reference temperature, normally near room temperature, at which the device is intended to operate.
$T_1$ and $T_2$ = the highest temperature to which the materials 1 and 2 are subjected to but not greater than the temperature at which the respective materials become almost molten or plastic.
$\alpha_1$ and $\alpha_2$ = the thermal coefficients of expansion of materials 1 and 2, respectively, expressed in $(°C.)^{-1}$.

In connection with Equation 1, the following should be noted:

(1) In cases wherein the materials are subjected to a temperature which cause the materials to become plastic, this Equation 1 will have to be modified slightly but still remains a fair approximation.

(2) Often $\alpha_1$, and $\alpha_2$ slowly vary with temperature, but for purposes of this approximation $\alpha_1$ and $\alpha_2$ are assumed to be constants.

(3) Material 2 is usually much thicker than Material 1 and may be a composite of two or more materials.

(4) The reason the stress may be considered as two dimensional is that the film is much thinner than the substrate.

In a typical heterogenous structure, such as an SOS structure involving the formation of a film of silicon on sapphire ($Al_2O_3$), by chemical vapor deposition (CVD), both the substrate and film are subjected to the same temperature cycle, in which case, Equation 1 reduces to:

Equation 1 $S \propto (\alpha_1 - \alpha_2) \Delta T$ where:

$\Delta T_1 = \Delta T_2 = \Delta T$

In a typical SOS CVD process $\Delta T$ is about 1000° C. and $\alpha_2 = 2 \alpha_1$ where $\alpha_1$ is the thermal expansion coefficient for Si and $\alpha_2$, the thermal expansion coefficient of sapphire. In this example, the stress in the Si film, S, will be a negative number indicating that the film will be subjected to a compressive stress.

Those skilled in the art teach that compressive thermal stress in Si on sapphire devices is an undesirable condition that should be avoided or at least minimized inferring that such stress reduces the electron mobility of the Si film. More specifically, Hyneak, in an article entitled "Elastoresistance of n-Type Silicon on Sapphire" *Journal of Applied Physics* V45 No. 6 June 74, studied the influence of stress on the electrical properties of SOS. He concluded, in general terms, that "the electron Hall mobility of the silicon on sapphire is always measured smaller than its corresponding bulk value by a factor of 2. Thus, by reducing the stress in SOS, a significant improvement in electrical properties could be obtained".

Sai-Halasz et al. in a paper entitled "Stress Relieved Regrowth of Silicon on Sapphire by Laser Annealing" *Appl. Phys. Lett.* 36(6) March 15, 1980, have considered this stress phenomena in SOS and proposed a solution which might minimize the adverse effect of the compressive strain induced in the Si film during CVD epitaxial growth of Si on sapphire. Their proposed solution is to subject the film and substrate to different temperatures by laser annealing the Si film. In this case, Equation 2 above is not applicable since $\Delta T_1$ no longer is equal to $\Delta T_2$. Instead, they make $\Delta T_1$ much greater than $\Delta T_2$ to offset the fact that $\alpha_1$ is much less than $\alpha_2$: thereby balancing out the effect of the different thermal expansion coefficients.

In homogeneous structures, where the film and substrate material are identical, thermally induced stress is usually not a factor provided both the film and substrate are subjected to the same temperature profile. This is for the reason that in the homogeneous case, $\alpha_1 = \alpha_2$ and if $\Delta T_1$ also equals $\Delta T_2$, according to Equation 1, S will equal zero.

The above examples relate to the background art status of planar or substantially "two dimensional" stress wherein the emphasis and objectives have been directed toward minimizing or reducing stress in the structure. Additionally, the background art comprises research into the effects of uniaxial (one dimensional) stress and hydrostatic (three dimensional) stress on the electrical properties of crystalline boules (bulk material).

For example, C. W. Smith, *Phys. Rev.* V94, 42, 1954, reports that uniaxial tension changes resistivity in bulk Si and Ge and quantifies and results of experiments on these materials. The prior art experiments show that the change in resistivity in bulk material is related to the type of doping i.e., n (electron) or p (holes) and the direction of the stress, i.e., compressive or tensile. Tensile stress decreases the mobility of holes and compressive stress decreases the mobility of electrons.

DISCLOSURE OF THE INVENTION

The present invention describes a method and apparatus for intentionally inducing thermal stress of the right type, i.e., compressive or tensile, in the fabrication of semiconductor thin films on substrates to improve the electrical properties of the film. One way this is accomplished, is by combining materials having appropriate thermal coefficients of expansion, such that when subjected to a heating cycle a stress will be induced in the film which will increase mobility (either electron), or hole mobility, depending on the doping).

For example, in the present invention, thin films of material of different thermal expansion characteristics are crystallized on a substrate. During the crystallization process, the materials (both film and substrate) are taken from ambient temperature to a much higher temperature; for example, by having upper and lower graphite strip heaters disposed adjacent the film and substrate material. This high temperature induces thermal stress in such heterogeneous structures.

By proper selection of the substrate and film material and careful control of the thermal cycle to which the substrate and film is exposed during the crystallization process, large area thin films can be produced with predetermined thermal stress incorporated therein which improve the electrical properties of the film, more specifically, by increasing the film conductivity or carrier mobility.

Mobility enhancements of up to about 70% for electrons and 10% for holes are possible in stressed films produced in accordance with the invention, as compared to unstressed films. It should be emphasized that enhancing mobility or film conductivity is very desirable for commercial applications since it enables production of devices with high speed performance. These and other advantages of the invention will be explained in detail in connection with the drawings.

BEST MODE FOR CARRYING OUT THE INVENTION

Figure 1:
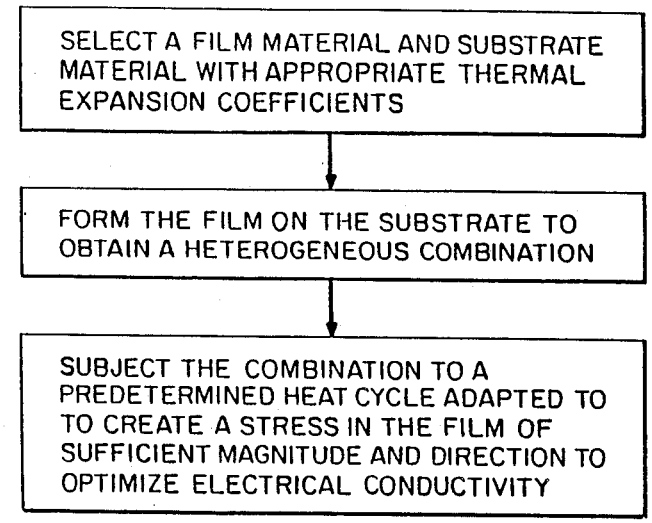
FIG. 1 is a process flow diagram for one embodiment of a process according to this invention.

FIG. 1 is a process flow sheet presenting the steps for one embodiment of this invention. In the first step of the process, a film material and a substrate body are selected which have the appropriate thermal expansion coefficient to produce a stress in the film of sufficient magnitude and in the direction which substantially increases electrical conductivity. In a majority carrier device, the electrical conductivity of the film which is increased may be the electron conductivity, for n-type doping of the film, or it may be the hole conductivity, if the film is doped with p-type dopants.

Next, the film is formed on the substrate to obtain a heterogeneous combination. The film may be formed on the substrate by any of several well known techniques, such as, thermal evaporation, sputtering, ion beam deposition, plating, or chemical vapor deposition.

After the film is formed on the substrate, the combination of film and substrate is subjected to a predetermined temperature cycle at a sufficient temperature and duration to induce the requisite stress for a given material and dopant.

Figure 2:
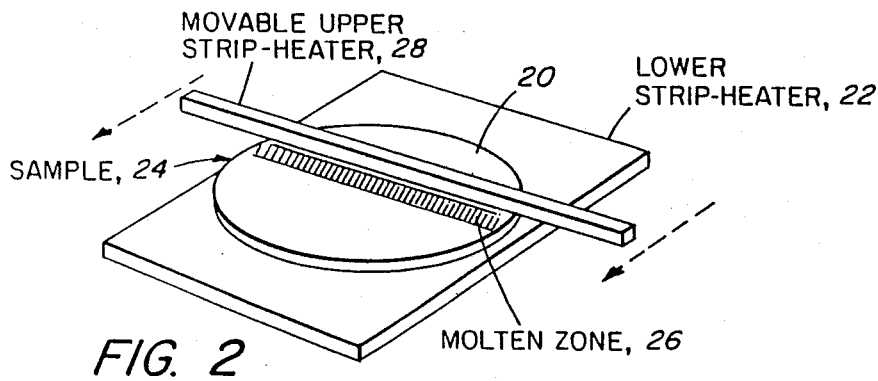
FIG. 2 is a perspective of a dual heater embodiment of the invention.

A preferred apparatus for inducing thermal stress in films is shown in FIG. 2. In this system, a two-step approach is used, wherein a sample to be processed, sample 24, which has been fabricated in accordance with the previous description, is placed on a lower graphite strip heater 20. The lower heater is energized by means (not shown) and brought to a temperature close to the melting point of the film material underneath the heater 28. Next, the upper heater 28 is translated past the top surface of sample 24 to cause the melting zone 26 to move in unison with the heater 28 to induce zone melting then solidification of the film layer of the sample 24 to achieve stressed crystallization of the film. In this manner, the film is melted while the substrate temperature is slightly below the melting point of the film.

Figures 3A, 3B, 3C:
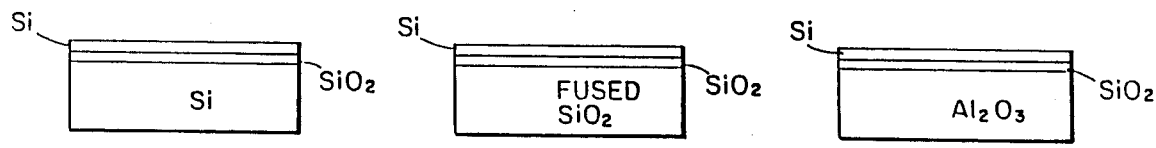
FIGS. 3A–C are cross-sectional views of samples fabricated to show the details of the invention.

In order to illustrate the invention, it may be helpful to consider the following tests which were conducted by fabricating six different samples, A, B, C, D, E, and F, as follows:

A. Sample A was a n-type doped 0.5 μm polycrystalline Si film formed on a <100> Si substrate as shown in FIG. 3A. A thin film (0.5 μm) of $SiO_2$ was interposed between the film and substrate for isolation purposes.

B. Sample B was a n-type doped 0.5 μm polycrystalline Si film formed on a fused silica ($SiO_2$) substrate as shown in FIG. 3B.

C. Sample C (as shown in FIG. 3C) was a n-type doped 0.5 μm polycrystalline Si film formed on a sapphire substrate.

D, E, and F. The D, E, and F samples were identical to respective samples A, B and C, except the dopant was a p-type. Optionally, in samples B, C, E and F, a thin film (0.5 μm) of $SiO_2$ may be interposed between the film and substrate to isolate the film from the substrate and prevent interaction between the two.

Each of these samples were formed, as previously described, by a two-step zone melting process wherein 0.5 μm Si Films were deposited by chemical vapor deposition on 0.5 μm $SiO_2$ layers on respective substrates of <100 Si, fused silica or sapphire, as the case may be.

After deposition, the samples were capped sequentially with a $SiO_2$ layer of 2 μm by CVD and a layer of $Si_3N_4$ of about 300 Angstroms using sputtering techniques. The $SiO_2$ and $Si_3N_4$ caps serve to wet the surface of the underlying layer as described in copending U.S. patent application, Ser. No. 254,871 now U.S. Pat. No. 4,371,421, entitled "Lateral Epitaxial Growth by Seeded Solidification" to Fan et al.

Next, the films in each case, were recrystallized using the previously described process and apparatus of FIG. 2. The samples were first heated to about 1300° C. (near the melting point 1410° C. of Si) with the lower strip heater 22 and then zone-melted by energizing the upper heater to induce melting of the Si film and then translating the upper heater past the sample at a rate of 1-2 mm/sec; causing the polycrystalline Si to be zone-melted and recrystallized. The recrystallized films contain large-grain crystals of size up to a few millimeters by a few centimeters and nearly all the crystals have a (100) surface texture. The crystallized films were then doped with donors (p-type) or acceptors (n-type) by ion implantation followed by thermal annealing at 950° C.

Note that since annealing is conducted at 950° C., below the temperature range at which the stress was induced, no detectible change in the stress occurred upon annealing.

The results of the above described films subjected to treatment are tabulated in Chart I below:

CHART I

| 1 Sample | 2 Film/Substrate | 3 Stress At Room Temp. | 4 Dopant Type | 5 Mobility (Rm. Temp) |
|---|---|---|---|---|
| A | *(100) Si/$SiO_2$/Si | None | n** | 500 $cm^2$/volt-sec |
| B | (100) Si/fused $SiO_2$ | Tensile | n** | 870 $cm^2$/volt-sec |
| C | (100) Si/$SiO_2$/sapphire | Compressive | n** | 325 $cm^2$/volt-sec |
| D | (100) Si/$SiO_2$/Si | None | P** | 180 $cm^2$/volt-sec |
| E | (100) Si/fused $SiO_2$ | Tensile | P** | 155 $cm^2$/volt-sec |
| F | (100) Si/$SiO_2$sapphire | Compressive | P** | 200 $cm^2$/volt-sec |

*Orientation of the film. The (100) crystal plane of the film is parallel to the surface.
**Both n-type and p-type samples are doped to a concentration of $1 \times 10^{17}$ $cm^{-3}$.

As may be seen in Chart I, the Sample A and D films resulted in no measurable stress in the films. This is to be expected since the structure is substantially homogeneous and each material was subjected to the same temperature excursion, inasmuch as the $SiO_2$ interlayer is so thin as to have minimal thermal effect on the device. However, because the thermal expansion coefficient of Si is less than that of sapphire and greater than that of fused silica, a tensile stress was induced in the films of Samples B and E whereas a compressive stress was induced in the Sample C and F films, all in accordance with the Equation I above.

The most significant result of these tests appears in column 5 where the electron or hole mobility of the samples are recorded. This data was obtained by Hall and resistivity measurements. As may be seen, the electron mobility is highest in films on fused silica substrates (Sample B) and the hole mobility is highest in films on sapphire substrates (Sample F). As compared to Samples A and D, (which are the unstressed Si greater for the intentionally stressed Sample B and the hole mobility was about 10% greater in the stressed Sample F.

It should be noted that the high temperatures induced in the two-step graphite heater process and precise control achieved enables reproducible stressed film to be attained in a precise and economical fashion. Also important is the fact that the films retain most of the built-in stress even after annealing and also retain the stress in operation at elevated temperatures not in excess of the melting temperature. In the stressed samples B, C, E and F, the magnitude of the stress obtained is in the order of 9 Kbar.

Chart II below shows the thermal expansion coefficient of various semiconductor films or substrate materials which may be candidates for application in accordance with the invention:

CHART II

Thermal Expansion Coefficient "α" $10^{-6}(°C.)^{-1}$

| | T(°C.) | | |
|---|---|---|---|
| Material | 25° | 500° | 1000° |
| Si | 2.5 | 4.1 | 5.0 |
| Ge | 5.7 | 6.9 | 7.7 |
| GaAs | 5.7 | 6.9 | 7.3 at 1000° K. |
| Fused $SiO_2$ | 0.49 | 0.53 | 0.37 at 1000° K. |
| $Si_3N_4$ | 0.8 | 3.1 | 3.6 at 1200° K. |
| | | at 700° K. | |
| Pyrex Glass | 3.2 | — | — |
| Sapphire | 6.0 | 8.9 | 9.5 |
| Spinel | 6.4 | — | 8.6 |
| W | 4.5 | 4.7 | 5.1 |
| Mo | 5.0 | 5.5 | 6.6 |

Based on Chart II, it is contemplated that electron/hole mobility enhancement would be attainable in accordance with the invention by inducing stress in films of the following composition:

(a) silicon film on a fused $SiO_2$ substrate where the Si film is n-doped;

(b) silicon film on a sapphire substrate where the Si film is p-doped;

(c) germanium film on a fused $SiO_2$ substrate with n-type doping of the Ge film;

(d) germanium film on a sapphire substrate with p-type doping of the Ge film.

Note that, as previously mentioned, the thermal expansion coefficient α varies with temperature as shown in Chart II. For practical application, however, one can assume an average value of α over the range of interest.

The effect of thermally induced stress on other heterogeneous combinations, such as gallium arsenide on fused $SiO_2$ or on sapphire, is presently not clear but it is believed that the teachings of the invention may find useful application on those structures as well.

Chart III below summarizes typical heterogeneous structures which will clearly be enhanced, albeit by different degrees, by treatment in accordance with the invention.

CHART III

| (1) Film/Substrate | (2) Stress | (3) Type of Carrier Enhancement | (4) Orientation |
|---|---|---|---|
| (1) Si/fused SiO$_2$ | Tensile | n (electron) | (100) |
| (2) Si/sapphire | Compressive | p (hole) | (111)* |
| (3) Ge/fused SiO$_2$ | Tensile | n | (111) |
| (4) Ge/sapphire | Compressive | p | (111) |

*For (100) orientation the effect may be less

In Chart III, Column 1 describes the combination of film material/substrate material; column 2 the direction of induced stress in the film; column 3 the type of carrier, electron or hole, whose mobility is enhanced in the film and column 4 the crystallographic orientation of the film and substrate material. Note that the electron may be a majority carrier in a "n"-doped film or a minority carrier in a "p"-doped film. Similarly, a hole may be a majority carrier in a "p"-doped film or a minority carrier in a "n"-doped film.

We have, therefore, shown that by proper selection of substrate/film material and the heating and cooling of the materials during the recrystallization process certain electrical properties may be enhanced. In accordance with the invention, large-area films, particularly Si films, with beneficial built-in stress are possible; wherein the direction of the stress improves the electrical conductivity properties of the film, as dictated by the properties of the substrate material dopant and the thermal cycle to which the materials are subjected.

We have emphasized thermally induced stress by heating of heterogeneous structures in the preferred embodiments above described, since such stress has the desirable advantage that once attained it will normally stay in the film under usual operating conditions. It is also possible that the requisite stress may be induced by other means, for example, by introducing controlled ambient pressure in the film deposition process. Such alternate stress means would enable the teaching of the invention to be applied equally to homogeneous structures, such as, Si on Si. The main prerequisite for applying such other stress inducing techniques is to establish a "static stress" which is stress that stays stable or is not intentionally modulated by normal ambients encountered in the operation of devices incorporating such stressed structures.

EQUIVALENTS

There are many equivalents to the embodiments specifically described herein and such equivalents are intended to be covered by the following claims. For example, although polycrystalline films are referred to in many instances, the term layer is meant to be equivalent to "film" and the "film" need not necessarily be "polycrystalline" and furthermore, the stress need not be induced in the entire film or layer. Instead, "islands" or "stripes" may be established or defined in the layer or film which may serve as a functional element of an end device and only these islands or stripes need to be treated in accordance with the invention.

We claim:

1. The method of forming a semiconductor device comprising the steps of:
  (a) forming a heterogeneous structure comprising: a first layer of Si or Ge semiconductor material over a SiO$_2$ or sapphire substrate in which the thermal coefficient of expansion of the semiconductor material is different than the thermal coefficient of expansion of the material of the substrate, and an intermediate layer positioned between the first layer and the substrate having minimal thermal stress isolation effect between the substrate and the first layer such that the intermediate layer substantially reduces interaction between the substrate and the first layer;
  (b) subjecting the structure to a temperature cycle by heating the heterogeneous structure with heater means to melt at least a substantial volume of the layer material while maintaining the substrate temperature below the melting point of the layer and the substrate and recrystallizing the melted layer while the substrate and layer temperature are within a range which induces a substantial thermal stress in a portion of the layer; wherein such stress is of the type which enhances charge carrier mobility properties of the layer, when the layer is recrystallized and doped with a suitble dopant, as compared to the carrier mobility of a layer having the same thermal coefficient of expansion as the substrate;
  (c) selecting a dopant such that if the induced thermal stress is tensile, the layer is doped with an n-type dopant and if the induced thermal stress is compressive, the layer is doped with a p-type dopant;
  (d) allowing the structure to cool to ambient temperature while retaining most of such stress.

2. The method of claim 1 including the step of:
  (e) annealing the first layer after step (d) at a temperature which does not relieve the induced thermal stress and which is below the melting point of the substrate or the layer material.

3. The method of claim 1 in which one or more thin layers of a wetting agent are applied over the first layer after formation of the first layer before subjecting the structure to said temperature cycle.

4. The method of claim 1 in which the first layer material is Si and the substrate material is fused SiO$_2$; the stress is tensile, the dopant is n-type, and the enhanced charge carrier mobility property is n-type carrier mobility.

5. The method of claim 1 in which the first layer material is Si and the substrate material is sapphire; the stress is compressive, the dopant is p-type, and the enhanced charge carrier mobility property is p-(hole) type carrier mobility.

6. The method of claim 1 in which the first layer material is Ge and the substrate material is fused SiO$_2$, the stress is tensile, the dopant is n-type, and the enhanced charge carrier mobility property is n-type carrier mobility.

7. The method of claim 1 in which the first layer material is Ge and the substrate material is sapphire; the stress is compressive, the dopant is p-type, and the enhanced charge carrier mobility property is p-type carrier mobility.

8. The method of fabricating at least a portion of a layer of Si or Ge semiconductor material on a SiO$_2$ or sapphire substrate body comprising the steps of:
  (a) selecting said semiconductor material and substrate body material and a suitable dopant for the semiconductor material which when treated in accordance with the following steps will produce a layer having a portion thereon in which a stress is induced which improves a charge carrier mobility property of the layer portion over that of an unstressed layer portion,
(b) forming a heterogeneous combination of a layer of said semiconductor material and said substrate body material, and an intermediate layer positioned between the first layer and the substrate body having minimal thermal stress isolation effect between the substrate body and the first layer such that the intermediate layer substantially reduces interaction between the substrate body and the first layer;
(c) forming a wetting agent layer over said semiconductor material layer,
(d) thereafter subjecting the substrate material and a substantial portion of layer material to a thermal stress inducing cycle using a heater which promotes thermal stress to melt the substantial portion of layer material while producing a substantial thermal stress in the substantial portion of layer material in an amount and of a type which improves a charge carrier mobility property in the substantial portion of layer material when suitably doped; said substantial thermal stress inducing cycle including the step of melting the layer material with said heater while maintaining the temperature of the substrate material below the temperature of the layer material and below the melting point of the substrate material and within a range that does not substantially relieve thermally induced stress,
(e) terminating said stress inducing cycle to crystallize said layer material while allowing the layer material to substantially retain said stress under normal operating conditions and subsequent processing temperatures and wherein if said stress is tensile in type, said layer material is doped with an n-type dopant and if compressive in type, said layer material is doped with a p-type dopant.

9. The method of claim 8 wherein the induced stress is achieved by melting of the layer material using a radiant heating element.

10. The method of claim 8 wherein the layer material is doped after the stress inducing cycle is terminated.

11. The method of fabricating at least a portion of a layer of Si or Ge semiconductor material on a SiO$_2$ or sapphire substrate material to form a layered heterobody, comprising the steps of:
(a) depositing a layer of said semiconductor material over said substrate material wherein said semiconductor layer and substrate are separated by an intermediate layer having minimal thermal stress isolation effect between the substrate and the semiconductor layer such that the intermediate layer substantially reduces interaction between the substrate and the semiconductor layer, and wherein said semiconductor layer and substrate have different thermal expansion coefficients such that when subjected to thermal stress, the electrical conductivity of the layer changes,
(b) thereafter subjecting the substrate material and layer material to a thermal stress inducing crystallization cycle from a heater means to produce a thermally induced stress in the layer material in an amount and direction which when said layer material is doped with a predetermined type of dopant improves a charge carrier mobility property in the doped layer material wherein said thermal stress inducing cycle includes the step of incrementally melting the layer material in zones with said heater means then solidifying the melted zones to produce thermally induced stressed crystallization of such zones while maintaining the temperature of the substrate material below its melting point and the temperature of the substrate and layer material within a range that does not substantially relieve such thermally induced stress,
(c) terminating said stress inducing and crystallization cycle and allowing said layered body to return to ambient temperatures without substantially relieving such stress,
(d) selecting a dopant for the layer material such that if the induced stress is tensile the selected dopant is n-type or if the induced stress is compressive the selected dopant is p-type, and
(e) doping the layer material with the selected dopant.

12. The method of forming a silicon on insulator semiconductor device comprising the steps of:
(a) forming a heterogeneous structure comprising a layer of silicon on an SiO$_2$ substrate;
(b) forming a thin wetting agent layer over said silicon layer;
(c) subjecting the structure to a temperature cycle with a heater means adapted to melt and recrystallize at least a zone of the silicon layer while maintaining the temperature of the SiO$_2$ substrate below its melting point and wherein the temperature of the zone and substrate is cycled in a range which thermally induces a tensile stress in the silicon zone upon recrystallization, which stress changes charge carrier mobility properties of the zone;
(d) allowing the structure to cool to ambient temperature such that the zone retains most of such tensile stress; and
(e) doping said portion with an n-type dopant to enhance carrier mobility or doping said portion with a p-type dopant to reduce carrier mobility.

13. The method of claim 12 wherein said zone is provided with an n-type dopant after the structure is allowed to cool to ambient.

14. The method of forming a silicon on sapphire semiconductor device comprising the steps of:
(a) forming a heterogeneous structure comprising a silicon layer over a sapphire substrate, and an intermediate layer positioned between the silicon layer and the substrate having minimal thermal stress isolation effect between the substrate and the silicon layer such that the intermediate layer substantially reduces interaction between the substrate and the silicon layer;
(b) forming a thin wetting agent layer over said silicon layer;
(c) subjecting the structure to a temperature cycle with a heater means for melting at least a zone of the silicon layer while maintaining the temperature of the substrate below its melting point and wherein the temperature of the zone and substrate is within a range which thermally induces a compressive stress in the silicon zone upon recrystallization, which stress changes charge carrier mobility properties of the silicon zone;
(d) allowing the structure to recrystallize and cool to ambient temperature while retaining such compressive stress; and
(e) doping said zone with a p-type dopant to enhance carrier mobility or doping with an n-type dopant to reduce the carrier mobility of the zone.

15. The method of claim 14 wherein the zone is doped with a p-type dopant after the structure is allowed to cool in step (d).

16. The method of claim 14 wherein doping is accomplished after the stress inducing and crystallization cycle is completed.

* * * * *